United States Patent [19]
Kitamura

[11] Patent Number: 6,075,276
[45] Date of Patent: *Jun. 13, 2000

[54] ESD PROTECTION DEVICE USING ZENER DIODES

[75] Inventor: Akio Kitamura, Nagano, Japan

[73] Assignee: Fuji Electric Company, Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,953

[22] Filed: Dec. 22, 1997

[30] Foreign Application Priority Data

Dec. 20, 1996 [JP] Japan ................................ 8-340305

[51] Int. Cl.[7] ...................... H01L 29/861; H01L 31/107
[52] U.S. Cl. .................. 257/481; 257/199; 257/482; 257/603; 257/606; 257/355; 257/546
[58] Field of Search ...................... 257/546, 551, 257/603, 355, 199, 481, 182, 606

[56] References Cited

U.S. PATENT DOCUMENTS

| | | | |
|---|---|---|---|
| 4,051,504 | 9/1977 | Hile | 257/551 |
| 4,405,933 | 9/1983 | Avery | 257/551 |
| 4,599,631 | 7/1986 | Tsuzuki | 257/551 |
| 4,626,882 | 12/1986 | Cottrell et al. | 357/23.13 |
| 4,979,001 | 12/1990 | Alter | 257/551 |
| 5,500,546 | 3/1996 | Marum et al. | 257/551 |
| 5,631,493 | 5/1997 | Pezzani | 257/551 |

FOREIGN PATENT DOCUMENTS 404372173  12/1992  Japan ................................ 257/355

*Primary Examiner*—David Hardy
*Assistant Examiner*—Jesse A. Fenty
*Attorney, Agent, or Firm*—Rossi & Associates

[57] ABSTRACT

A semiconductor device is provided which includes a first conductivity type semiconductor substrate, a second conductivity type Zener region formed in a surface layer of the first conductivity type semiconductor substrate, a first conductivity type anode region formed within the second conductivity type Zener region, an anode electrode which is formed in contact with both of the semiconductor substrate and first conductivity type anode region and is grounded, and a cathode electrode formed on a surface of the second conductivity type Zener region and connected to input and output terminals. A diode that consists of the first conductivity type semiconductor substrate and the second conductivity type Zener region and a diode that consists of the first conductivity type anode region and the second conductivity type Zener region serve as protective elements for preventing electrostatic breakdown of the semiconductor device.

6 Claims, 3 Drawing Sheets

ESD PROTECTION DEVICE USING ZENER DIODES

FIELD OF THE INVENTION

The present invention relates to a measure to prevent electrostatic breakdown of a semiconductor device, and in particular to a semiconductor device that has a protective element for preventing electrostatic breakdown caused by electrostatic pulses from input and output terminals.

BACKGROUND OF THE INVENTION

As a measure to prevent electrostatic breakdown caused by electrostatic pulses from input and output terminals, it has been known to use n well-p substrate diodes or MOSFET parasitic diodes as protective devices elements.

FIG. 3 is a cross sectional view showing a diode portion of a known semiconductor device having a p substrate-n well diode. An n well region 311 is formed in a surface layer of a p substrate 301, to provide a p substrate-n well diode 312. A cathode electrode 306 is formed in contact with a high concentration n cathode region 304 that is formed in the n well region 311, and this electrode 306 is connected to input and output terminals (not shown). A high concentration $p^+$ pickup region 302 is formed in another surface portion of the p substrate 301, and an anode electrode 307 is formed in contact with a surface of the pickup region 302 such that the electrode 307 is grounded. Reference numeral 310 denotes an oxide film.

FIG. 4 is a cross sectional view showing a diode portion of another known semiconductive device having MOS diodes. An n well region 411 is formed in a surface layer of a p substrate 401, and p source region 420 and p drain region 419 are formed in the n well region 411. A gate electrode layer 422 made of polycrystalline silicon is formed on a gate oxide film 426 over a surface portion of the n well region 411 between the p source region 420 and p drain region 419, to thus provide a p channel MOSFET. A high concentration $n^+$ pickup region 421 and the p source region 420 have a common source electrode 423 formed thereon. In this known example, the source electrode 423 is also connected to the gate electrode layer 422. Also, a p well region 413 is formed in another portion of the surface layer of the p substrate 401, and n source region 414 and n drain region 415 are formed in the p well region 413. A gate electrode layer 416 made of polycrystalline silicon is formed on a gate oxide film 427 over a surface portion of the p well region 413 between the n source region 414 and n drain region 415, to thus provide an n channel MOSFET. A high concentration $p^+$ pickup region 402 and the n source region 414 have a common source electrode 417 formed thereon. In this known example, the source electrode 417 is also connected to the gate electrode layer 416. A drain electrode 418 that is in contact with both the p drain region 419 of the p channel MOSFET and the n drain region 415 of the n channel MOSFET is connected to input and output terminals. The p well region 413 and n drain region 416 constitute a p well-n drain diode 424, and the p drain region 419 and n well region 411 constitute a p drain-n well diode 425. These diodes 424, 425 provide protective elements for preventing electrostatic breakdown caused by electrostatic pulses from the input and output terminals.

The p substrate-n well diode 312 of FIG. 3 has high internal resistance, and therefore a large diode area is required for sufficiently absorbing electrostatic pulses from the input and output terminals. Although the MOS diodes of FIG. 4 can deal with positive and negative pulses by use of the n channel MOSFET and p channel MOSFET, both of the p well-n drain diode 424 and p drain-n well diode have high internal resistance, and therefore require large diode areas, as in the case of the p substrate-n well diode of FIG. 3 as described above. During use of the semiconductor device of FIG. 4, a four-layer structure consisting of the p drain region 419, n well region 411, p well region 413 and n source region 414 may latch up in some cases.

SUMMARY OF THE INVENTION

It is therefore an object of the present invention to provide a semiconductor device having an input/output protective element that has a high area efficiency and high capability to withstand electrostatic breakdown.

To accomplish the above object, there is provided a semiconductor device which comprises: a first conductivity type semiconductor substrate; a second conductivity type Zener region formed in a surface layer of the first conductivity type semiconductor substrate; a first conductivity type anode region formed within the second conductivity type Zener region; an anode electrode formed in contact with both of the semiconductor substrate and the first conductivity type anode region, the anode electrode being grounded; and a cathode electrode formed on a surface of the second conductivity type Zener region and connected to input and output terminals.

In the semiconductor device constructed as described above, a diode consisting of the first conductivity type semiconductor substrate and the second conductivity type Zener region, and a diode consisting of the first conductivity type anode region and the second conductivity type Zener region are formed, so as to deal with positive and negative pulses from the input and outer terminals.

The semiconductor device of the invention may further include a second conductivity type well region that surrounds the second conductivity type Zener region. In this case, a diode consisting of the first conductivity type semiconductor substrate and the second conductivity type Zener region and a diode consisting of the first conductivity type anode region and the second conductivity type well region are formed, and the internal resistance of these diodes can be reduced.

In particular, the second conductivity type Zener region has a surface impurity concentration of not lower than $1\times10^{18}$ cm$^{-1}$.

The breakdown voltage of a pn junction greatly depends on the impurity concentration of a low concentration region constituting the pn junction, and the breakdown voltage is reduced as the impurity concentration is increased (for example, refer to "Physics and Technology of Semiconductor Devices", p. 216, A. S. Grove, published by McGraw-Hill, Inc. in 1986). If the surface impurity concentration of the second conductivity type Zener region as the low concentration region is equal to or higher than $1\times10^{18}$ ccm$^{-3}$, the diode consisting of the first conductivity type anode region and the second conductivity type Zener region mainly undergoes Zener breakdown, and the breakdown voltage is about 10V or lower, thus making it possible for the diode to absorb low-voltage pulses. Further, the internal resistance of the diode is reduced as the impurity concentration of the lower concentration region is increased.

Preferably, a Zener diode consisting of the second conductivity type Zener region and the first conductivity type anode region has a breakdown voltage of not higher than 6V. In this case, the diode is able to absorb low-voltage pulses, and its internal resistance is reduced.

BRIEF DESCRIPTION OF THE DRAWINGS

The invention will be described in greater detail with reference to a preferred embodiment thereof and the accompanying drawings, wherein.

DETAILED DESCRIPTION OF THE PREFERRED EMBODIMENT

Figure 1A:
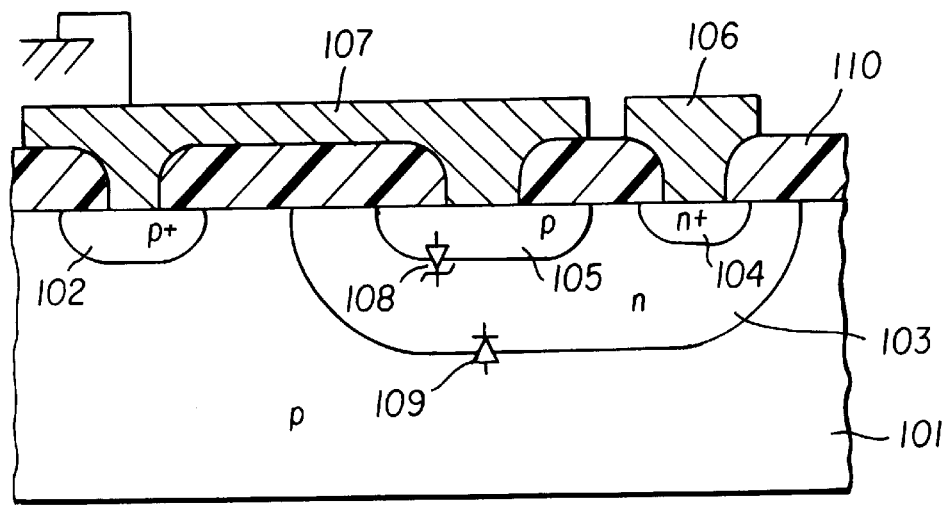
FIG. 1(a) is a cross sectional view showing a portion of a semiconductor device having protective elements according to the first embodiment of the present invention.

FIG. 1(a) is a cross sectional view showing a portion of a semiconductor device having protective elements according to the first embodiment of the present invention.

An n Zener region 103 is formed in a surface layer of a p substrate 101 having a resistivity of about 15 $\Omega$.cm, by implantation of phosphorous ions and heat treatment, so as to provide a p substrate-n Zener diode 109. This n Zener region 103 has a dose amount of about $1 \times 10^{14}$ cm$^{-2}$, a surface concentration of about $1 \times 10^{18}$ cm$^{-3}$ after diffusion, and a diffusion depth of about 1.5 $\mu$m. A p anode region 105 is formed in a surface layer of the n Zener region 103 by implantation of boron ions and heat treatment, so as to provide a p anode-n Zener diode 108. The p anode region 105 has a surface concentration of about $3 \times 10^{19}$ cm$^{-3}$ and a diffusion depth of about 0.4 $\mu$m. This p anode region 105 is connected through the anode electrode 107 to a p$^+$ pickup region 102 that is formed in the surface layer of the p substrate 101, and the p substrate 101 is grounded. A cathode electrode 106 is formed in contact with a surface of an n$^+$ cathode region 104 that is formed in the surface layer of the n Zener region 103, and is connected to an output terminal (not shown). Each of the p$^+$ pickup region 102 and n$^+$ cathode region 104 is a high impurity concentration region that is to be in contact with a corresponding electrode. For example, the p$^+$ pickup region 102 has a diffusion depth of 0.4 $\mu$m, and the n$^+$ cathode region 104 has a diffusion depth of 0.25 $\mu$m. Reference numeral 110 denotes an oxide film. The anode electrode 107 and cathode electrode 106 are both made of an aluminum alloy, for example, and formed at the same time that the other electrodes of the semiconductor device is formed.

Figure 1B:
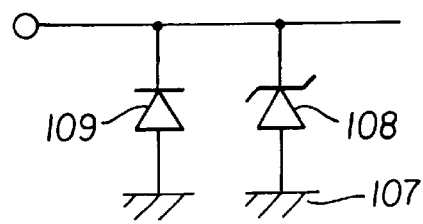
FIG. 1(b) is a view showing an equivalent circuit including the protective elements of the semiconductor device of FIG. 1(a)
Figure 1C:
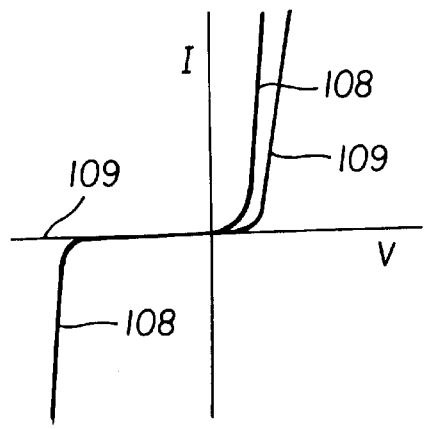
FIG. 1(c) is a view showing electric characteristics of the protective elements of the semiconductor device of FIG. 1(a)

FIG. 1(b) shows an equivalent circuit of a portion of the semiconductive device of FIG. 1 including the protective elements, and FIG. 1(c) shows electric characteristics of the p anode-n Zener diode 108 and the p substrate-n Zener diode 109. As shown in FIG. 1(b), the p anode-n Zener diode 108 and the p substrate-n Zener diode 109 are connected in parallel with each other. Comparing these diodes, the internal resistance of the p anode-n Zener diode 108 is far smaller than that of the p substrate-n Zener diode 109 not only in their forward characteristics but also in their reverse characteristics, as shown in FIG. 1(c). Since both of the p anode region 105 and n Zener region 103 have high impurity concentrations, the breakdown voltage of the p anode-n Zener diode 108 is about 6V, while the breakdown voltage of the p substrate-n Zener diode 109 is equal to or higher than 50V.

Electrostatic pulses that are received from the input and output terminals connected to the cathode electrode 106 include positive pulses and negative pulses. When a positive pulse is applied to the semiconductor device, the pulse is absorbed by the p anode-n Zener diode 108 since the withstand voltage of the p substrate-n Zener diode 109 is equal to or higher than 50V. Since the Zener voltage of the p anode-n Zener diode 108 is as low as about 6V, and both the p anode region 105 and n cathode region 104 have high impurity concentrations, the p anode-n Zener diode 108 provides low internal resistance and very high junction capacitance.

When a negative pulse is applied, both of the above two diodes are forward biased, but the pulse is mainly absorbed by the p anode-n Zener diode 108 whose internal resistance is considerably reduced as described above. As in the case where a positive pulse is applied, this p anode-n Zener diode 108 provides very high junction capacitance.

The semiconductor device having the protective elements as described above was subjected to a test (EIAJED-4701-1) for measuring the capability to withstand electrostatic breakdown. As a result, the semiconductor device of the present embodiment exhibited improved capability to withstand electrostatic breakdown, more specifically, 500V or greater in a machine mode and 3000V or greater in a human body mode.

Also, the structure of the present embodiment does not suffer from latch up that would occur in the known device having MOS diodes as protective elements. Further, the area required for the protective elements can be reduced by about 50% as compared with the known MOS diodes.

Figure 2:
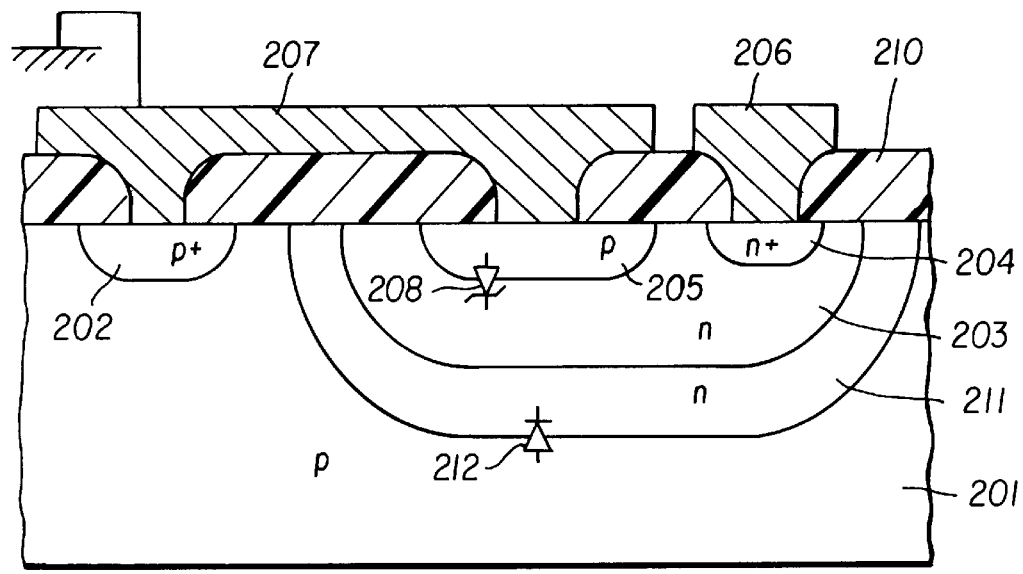
FIG. 2 is a cross sectional view showing a portion of a semiconductor device having protective elements according to the second embodiment of the present invention.
Figure 3:
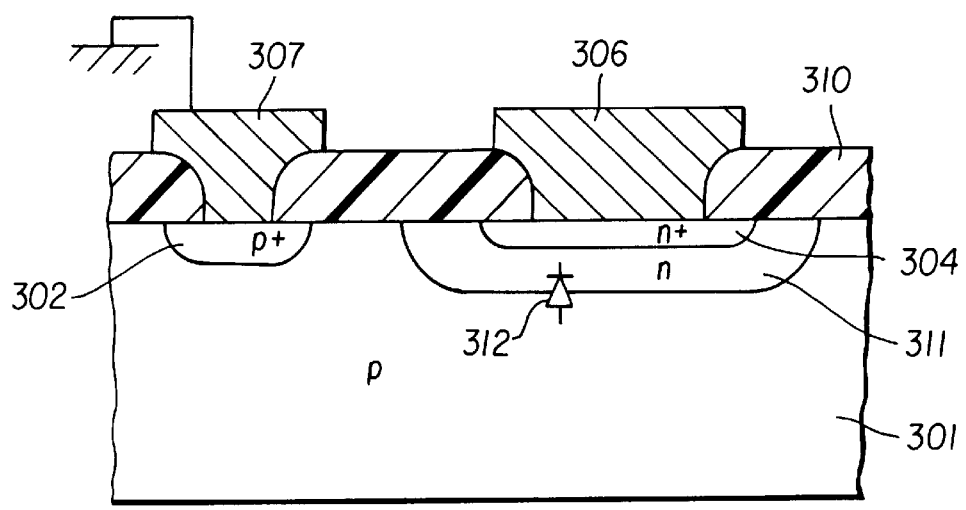
FIG. 3 is a cross sectional view showing a known example having a p substrate-n well diode.
Figure 4:
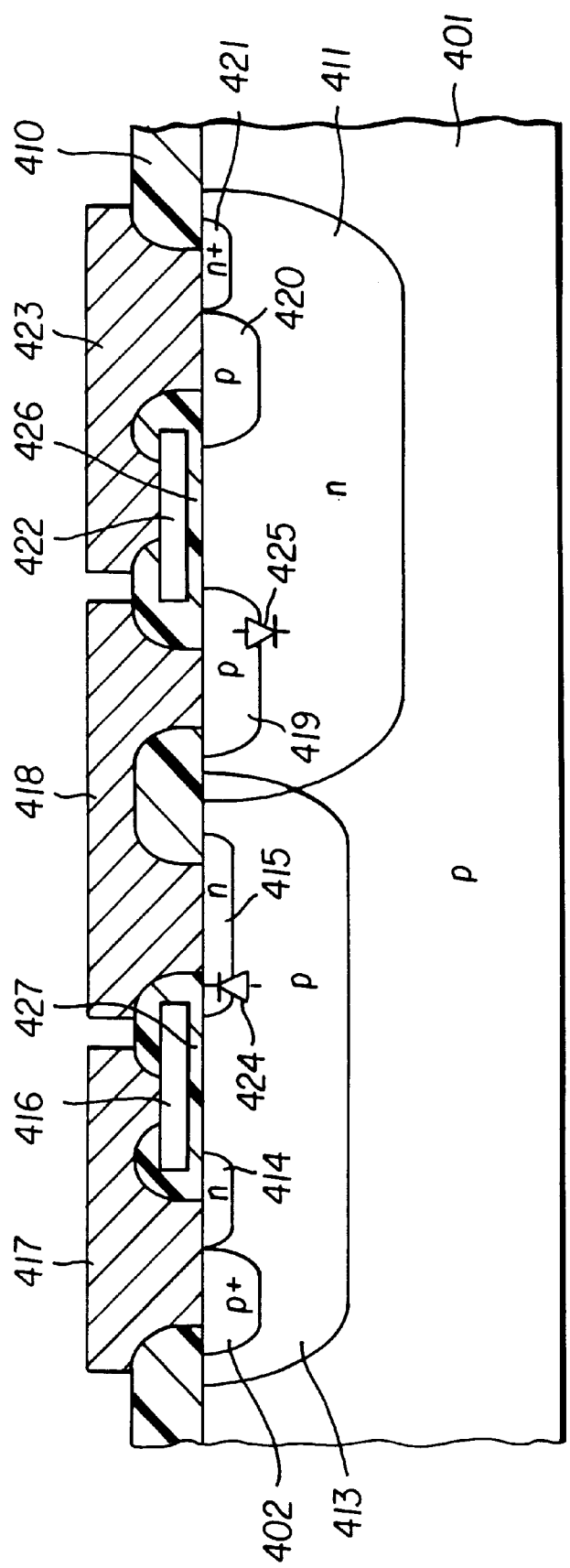
FIG. 4 is a cross sectional view showing a known example having a MOS diodes.

FIG. 2 is a cross sectional view showing a portion of the semiconductor device having protective elements according to the second embodiment of the present invention. In this embodiment, a layer of an n well region 211 is added to the structure of the first embodiment. The n well region 21 is usually formed at the same time that the other constituent portions of the semiconductor device are formed, and has a surface impurity concentration of $3 \times 10^{17}$ cm$^{-3}$ and a diffusion depth of 4 $\mu$m, for example.

The second embodiment constructed as described above has protective elements in the form of a p anode-n Zener diode 208 that consists of a p anode region 205 and an n Zener region 203, and a p substrate-n well diode 212 that is formed in parallel with the diode 208 and consists of a p substrate 201 and the above-described n well region 211.

The semiconductor device of the second embodiment also exhibited remarkably improved capability to withstand electrostatic breakdown. This is because the p substrate-n well diode 212 has a considerably high withstand voltage of about 200V, with its internal resistance increased to be higher than that of the p substrate-n Zener diode 109 of the first embodiment. On the other hand, the withstand voltage of the p anode-n Zener diode 208 is further reduced with a result of further reduction in its internal resistance since the impurity concentration of the n Zener region 203 at the pn junction between the p anode region 205 and n Zener region 203 is higher than that of the first embodiment. Thus, the contribution of the p anode-n Zener diode 208 to the improvement in the capability to withstand electrostatic breakdown is increased.

According to the present invention as described above, the high concentration second conductivity type Zener region is formed in a surface layer of the first conductivity type semiconductor substrate, and the diode consisting of the first conductivity type semiconductor substrate and second conductivity type Zener region and the diode consisting of the first conductivity type anode region and second conductivity type Zener region are formed in parallel with each other, to thus provide input/output protective elements having high capability to withstand electrostatic breakdown and reduced areas. The resulting semiconductor device also has high resistance to latch up.

What is claimed is:

1. A semiconductor device comprising:

a first conductivity type semiconductor substrate having a first surface and a second surface;

a second conductivity type Zener region formed in a surface layer of said first surface of said first conductivity type semiconductor substrate;

a first conductivity type anode region formed within said second conductivity type Zener region;

an anode electrode formed in contact with both said first surface of said semiconductor substrate and said first conductivity type anode region, wherein said anode electrode is grounded;

a cathode electrode formed on a surface of said second conductivity type Zener region and connected to input and output terminals; and a pickup region formed in the surface layer of said first surface of said first conductivity type semiconductor substrate;

wherein a PN junction between said first conductivity type anode region and said second conductivity type Zener region comprises a Zener diode; and wherein said anode electrode contacts said pickup region.

2. A semiconductor device according to claim 1, further comprising a second conductivity type well region that surrounds said second conductivity type Zener region.

3. A semiconductor device according to claim 1, wherein said second conductivity type Zener region has a surface impurity concentration of not lower than $1\times10^{18}$ cm$^{-3}$.

4. A semiconductor device according to claim 1, wherein said second conductivity type Zener region and said first conductivity type anode region constitute a Zener diode that has a breakdown voltage of not higher than 6V.

5. A semiconductor device according to claim 2, wherein said second conductivity type Zener region has a surface impurity concentration of not lower than $1\times10^{18}$ cm$^{-3}$.

6. A semiconductor device according to claim 2, wherein said second conductivity type Zener region and said first conductivity type anode region constitute a Zener diode that has a breakdown voltage of not higher than 6V.

* * * * *